(12) United States Patent
Haga et al.

(10) Patent No.: US 7,078,921 B2
(45) Date of Patent: Jul. 18, 2006

(54) CONTACT PROBE

(75) Inventors: Tsuyoshi Haga, Ako-gun (JP); Shigeki Shimada, Osaka (JP); Atsushi Kimura, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/473,354

(22) PCT Filed: Oct. 10, 2002

(86) PCT No.: PCT/JP02/10563

§ 371 (c)(1),
(2), (4) Date: Sep. 30, 2003

(87) PCT Pub. No.: WO03/056346

PCT Pub. Date: Jul. 10, 2003

(65) Prior Publication Data

US 2004/0104737 A1    Jun. 3, 2004

(30) Foreign Application Priority Data

Dec. 25, 2001  (JP) ............................. 2001-391266
Dec. 26, 2001  (JP) ............................. 2001-393531
Mar. 8, 2002   (JP) ............................. 2002-063346

(51) Int. Cl.
  *G01R 31/02*  (2006.01)
  *G01R 31/26*  (2006.01)
(52) U.S. Cl. ...................... 324/754; 324/756; 324/761; 439/86
(58) Field of Classification Search ......... 324/750–765
See application file for complete search history.

(56) References Cited

U.S. PATENT DOCUMENTS 5,767,691 A  * 6/1998  Verkuil ..................... 324/761
5,890,390 A    4/1999  Throssel
5,932,323 A    8/1999  Throssel
6,633,176 B1 * 10/2003 Takemoto et al. ......... 324/754

(Continued)

FOREIGN PATENT DOCUMENTS

EP    0 752 594 A2    1/1997

(Continued)

OTHER PUBLICATIONS

U.S. Appl. No. 10/470,399.

*Primary Examiner*—Vinh Nguyen
*Assistant Examiner*—Emily Y Chan
(74) *Attorney, Agent, or Firm*—McDermott Will & Emery LLP

(57) ABSTRACT

A contact probe comprises a tip portion for making contact with a subject surface, a supporting portion, and a spring portion for connecting the other two members. The tip portion has a corner portion whose radius of curvature is larger than that of the opposite corner portion that moves in the lead during the scrubbing by the pressing force. The insulating layer on the subject surface is sufficiently removed by the scrubbing to secure the electrical contact, and the amount of shavings is minimized during the dissociation of the contact probe. Formation of scratches on the subject surface is reduced. Another contact probe for a ball-shaped electrode has a tip portion with a recess, which has a protrusion and bottom. The protrusion breaks the insulating layer on the electrode to secure the electrical contact. The bottom makes contact with the electrode to prevent the protrusion from excessively biting the electrode.

5 Claims, 17 Drawing Sheets

U.S. PATENT DOCUMENTS

2001/0046715 A1   11/2001   Takemoto et al.
2002/0097060 A1*   7/2002   Maekawa et al. ........... 324/754

FOREIGN PATENT DOCUMENTS

| | | |
|---|---|---|
| EP | 0 063 727 A2 | 12/2000 |
| JP | 2-229450 | 9/1990 |
| JP | 5-273237 | 10/1993 |
| JP | 10-221367 | 8/1998 |
| JP | 11-326373 | 11/1999 |
| JP | 2000-241450 | 9/2000 |
| JP | 2000-338175 A | 12/2000 |
| JP | 2001-147004 A | 5/2001 |
| JP | 2001-311746 | 11/2001 |
| JP | 2001-343397 | 12/2001 |
| JP | 2002-303637 | 10/2002 |

* cited by examiner

CONTACT PROBE

RELATED APPLICATION

This application is a 371 of PCT/JP 02/10563 filed on Oct. 10, 2002 under No. PCT/JP02/10563.

TECHNICAL FIELD

The present invention relates to a contact probe for electrically inspecting semiconductor substrates, liquid-crystal displaying devices, and other devices.

BACKGROUND ART

Inspection of the electric circuits formed for semiconductor substrates, liquid-crystal displaying devices, and other devices is usually conducted by using an inspecting apparatus provided with a multitude of contact probes. The surface of a circuit to be measured (hereinafter referred to as a subject surface) is usually covered by an insulating layer, such as a naturally formed oxide layer or resist residues. To carry out the inspection, it is necessary to break the insulating layer to secure reliable electrical contact with the electrode of the circuit underneath the insulating layer. Two methods have been employed to break the insulating layer. One is to scrub along the subject surface to remove the insulating layer so that the electrical contact with the electrode underneath can be secured. The other is to press a sharp edge against the insulating layer to penetrate through it.

In this specification, the term "scrub" is used to mean to scrub a subject surface by using a sharp edge. Researchers and engineers have proposed a process known as the lithographie galvanoformung abformung (LIGA) process for forming a contact probe that performs the foregoing "scrubbing." According to this process, a contact probe is formed by lithography and plating using a mask having a specified pattern as explained in the published Japanese patent application Tokukai 2001-343397, for example.

Examples of the conventional shape of contact probes formed by the LIGA process are shown in FIGS. 12 and 13. These contact probes comprise a tip portion 1 for making contact with a subject surface 20, a spring portion 2 having a bent portion, and a supporting portion 3 for supporting the contact probe attached to an inspecting apparatus. The shape of the spring portion 2 is not limited to the unidirectionally bending shape as shown in FIGS. 12 and 13; an S shape or a waving shape also can be used. As shown in FIG. 14, a contacting flat face 10 is provided at the lowermost part of the tip portion 1. An oblique face 15 is provided at each side of the contacting flat face 10. When the supporting portion 3 of the contact probe shown in FIG. 12 is fixed to an inspecting apparatus and when the contact probe is pressed perpendicularly against the subject surface 20, the contacting flat face 10 of the tip portion 1 makes area contact with the subject surface 20, and the spring portion 2 deforms elastically in a direction shown by an arrow 31. During this elastic deformation, the posture of the tip portion 1 is constrained by the force that presses it against the subject surface 20. Consequently, the tip portion 1 moves in a direction shown by an arrow 32 nearly maintaining the posture of the area contact with the subject surface 20. Thus, the "scrubbing" is performed.

The performance of the contact probe shown in FIG. 13 is similarly explained below. When the supporting portion 3 of the contact probe is fixed to an inspecting apparatus and when the contact probe is pressed perpendicularly against the subject surface 20, the contacting flat face 10 of the tip portion 1 makes area contact with the subject surface 20, and the spring portion 2 deforms elastically in a direction shown by an arrow 33. During this elastic deformation, the posture of the tip portion 1 is constrained by the force that presses it against the subject surface 20. Consequently, the tip portion 1 moves in a direction shown by an arrow 34 nearly maintaining the posture of the area contact with the subject surface 20. Thus, the "scrubbing" is performed.

The moving direction of the tip portion 1 pressed against the subject surface 20 is determined by the shape and the relative position of the tip portion 1, the spring portion 2, and supporting portion 3 when the contact probe is formed as a unitary structure with the same material. When different materials are used for individual portions, the types of the materials are also a factor to determine the direction.

A series of the operation from the start of the contact of the tip portion 1 with the subject surface 20 to the end of the contact is explained in detail below by referring to FIGS. 15 to 17. In the case of the example shown in FIG. 15, the subject to be measured is a substrate 21 provided with an aluminum electrode 22 on the surface. The surface of the aluminum electrode 22 is the subject surface 20. The surface of the aluminum electrode 22 is covered with a naturally formed oxide layer 25. As shown in FIG. 15, the tip portion 1 of the contact probe descends from immediately above in order for the contacting flat face 10 to make contact with the subject surface 20. As shown in FIG. 16, the elastic deformation of the spring portion 2 (not shown in FIG. 16) moves the tip portion 1. In the case of the example shown in FIG. 16, the tip portion 1 is assumed to move to the right. In this case, because the tip portion 1 is pressed against the subject surface 20, it moves to the right maintaining the posture of the contact between the contacting flat face 10 and the subject surface 20. Thus, the "scrubbing" is performed. During this operation, the tip portion 1 scrubs away the oxide layer 25, forming scratches 24. Under this condition, the tip portion 1 can secure the electrical contact with the aluminum electrode 22 previously covered by the oxide layer 25, enabling the measurement through the contact probe.

After the measurement, the contact probe ascends. However, the tip portion 1 does not ascend directly from the position shown in FIG. 16. As shown in FIG. 17, as the spring portion 2 decreases its elastic deformation, the tip portion 1 moves to the left while continuing to scrub the surface and then moves upward.

As shown in FIGS. 16 and 17, the scrubbing allows shavings 23 of the aluminum electrode 22 and the oxide layer 25 to adhere to the tip portion 1. Every measurement with the contact probe requires the operations shown in FIGS. 15 to 17. The shavings 23 adhere to the tip portion 1 not only when the scrubbing is performed by pressing the contact probe to the subject surface 20 as shown in FIG. 16 but also when the scrubbing is performed during the dissociation of the contact probe from the subject surface 20 as shown in FIG. 17. The latter scrubbing does not contribute to the measurement, although it is inevitable. The adhering shavings 23 decrease the quality of the electrical contact of the contact probe in the next measurement. Consequently, to maintain good electrical contact to a certain extent, it is necessary to clean the tip portion 1 after a certain number of measurements are carried out, for example, 1,000 times. The cleaning requires discontinuation of the measurement, thereby decreasing the productivity.

Excessive adherence of the shavings 23 diminishes the measurement accuracy, and a good product may be judged as unsatisfactory. This misjudgment causes an otherwise unnecessary reduction of yield.

Furthermore, as described above, the tip portion 1 produces the scratches 24 on the subject surface 20 not only when the scrubbing is performed by pressing the contact probe against the subject surface 20 for securing the electrical contact as shown in FIG. 16 but also when the scrubbing is performed during the dissociation of the contact probe from the subject surface 20 after the measurement as shown in FIG. 17. Consequently, the scratches 24 on the surface of the aluminum electrode 22 grow in excess of the extent necessary to break the insulating layer. The excessive scratches may cause unsatisfactory bonding between the aluminum electrode 22 and a gold wire in the subsequent ultra-sonic bonding process, because the alloying process between the aluminum electrode 22 and the gold wire does not proceed properly.

In addition, the subject surface is not necessarily a flat surface. It may be a curved surface, such as the surface of a ball. For example, a ball grid array (BGA) package 70 shown in FIG. 28 requires measurement by making contact with solder balls 72 arranged on the undersurface of a BGA substrate 71. Several contact probes have been proposed for the inspection through the foregoing solder balls 72. These contact probes and problems caused by them are explained below.

A first prior art for a ball-shaped subject surface uses a contact probe 100 shown in FIG. 29, which is one of the POGO® pin types. The contact probe 100 comprises a tip portion 121 for making contact with a subject surface and a spring portion 122 for connecting the tip portion 121 to a cylindrical supporting portion 123. The contact probe 100 is produced by machining. The tip portion 121 and the supporting portion 123 basically have a cylindrical shape, and the upper end of the tip portion 121 has a conical shape. The spring portion 122 is made of a coil spring. As shown by an arrow in FIG. 29, the contact probe 100 placed immediately under a solder ball 72 moves upward and causes the conical end of the tip portion 121 to penetrate through the insulating layer formed on the surface of the solder ball 72 so that electrical continuity with the solder ball 72 can be secured.

However, as shown in FIG. 30, the contact probe 100 leaves a dent 53 on the solder ball 72 after the measurement. As shown in FIG. 31, when the solder ball 72 having the dent 53 is used for soldering with a pad electrode 73 on a circuit substrate 74, the dent 53 forms an enclosed space surrounded by the solder ball 72 and the pad electrode 73. When the assembly is heated for soldering under this condition, the air in the enclosed dent 53 expands and may burst the solder ball 72. This phenomenon known as the "popcorn phenomenon" causes unsatisfactory connection, which is a serious problem.

A second prior art for a ball-shaped subject surface has proposed a contact probe 101 shown in FIG. 32. The contact probe 101 comprises a pair of arms 114 that can open and close like a pair of tweezers. Each of the arms 114 is provided at the tip portion with a claw 112 that faces the other claw 112. As shown by an arrow in FIG. 32, the contact probe 101 rises from below. As shown in FIG. 33, the pair of arms 114 move in a direction toward the closed position so that the claws 112 can engage with the solder ball 72 from the side. As a result, the insulating layer on the surface of the solder ball 72 is broken, and the electrical continuity between the contact probe 101 and the solder ball 72 can be secured.

However, the contact probe 101 has a drawback. It is difficult to adjust the closing movement of the arms 114 against the diameter of the solder ball 72. If the degree of the closing of the arms 114 is insufficient, the claws 112 cannot penetrate sufficiently. Conversely, if the degree of the closing of the arms 114 is excessive, the claws 112 penetrate excessively, damaging the solder ball 72 or making themselves locked. If the locking occurs, the claws 112 cannot be separated from the solder ball 72. Consequently, when the contact probe 101 descends, the claws 112 tear off the solder ball 72 from the BGA substrate 71, creating a problem. The contact probe 101 has another drawback in that it requires a complex mechanism for opening and closing the arms 114.

A third prior art for a ball-shaped subject surface has proposed a contact probe 102 shown in FIG. 34. The contact probe 102 has a cylindrical tip portion whose upper end forms a sharp edge 115. When the contact probe 102 is used, as shown by an arrow in FIG. 34, the cylindrical tip portion rises toward the solder ball 72. As a result, as shown in FIG. 35, the edge 115 penetrates through the insulating layer on the surface of the solder ball 72, securing the electrical continuity between the contact probe 102 and the solder ball 72.

However, it is difficult to produce with high precision the cylindrical tip portion of the contact probe 102. If the edge 115 has a diameter larger than that of the solder ball 72 to a certain extent, the edge 115 may push the solder ball 72 into the cylindrical tip portion of the contact probe 102 without penetrating into the solder ball 72 as shown in FIG. 36. In this case, an accurate measurement cannot be conducted because the insulating layer on the surface of the solder ball 72 is not broken. If this phenomenon occurs, when the contact probe 102 descends, it may tear off the solder ball 72 from the BGA substrate 71.

DISCLOSURE OF THE INVENTION

A general object of the present invention is to offer a method that secures reliable electrical contact with an electrode hidden underneath an insulating layer, such as a naturally formed oxide layer or resist residues, existing on the surface of a subject surface. Accordingly, a particular object of the present invention is to offer a contact probe that can secure electrical contact with the electrode by scrubbing away the insulating layer on the electrode such that the amount of shavings adhering to the tip portion is reduced and the scratches formed on the surface of the subject surface is decreased.

Another particular object is to offer a contact probe that can secure electrical continuity by breaking the insulating layer formed on a curved subject surface of a ball-shaped electrode such as a solder ball without tearing off the ball-shaped electrode or excessively damaging it.

To attain the foregoing object, a contact probe (referred to as a first contact probe in this section of "Disclosure of the Invention") in accordance with an aspect of the present invention comprises:

(a) a tip portion that makes contact with a subject surface;
(b) a supporting portion that supports the other portions and performs electrical connection; and
(c) a spring portion that connects the tip portion to the supporting portion.

The tip portion of the first contact probe comprises:

(a) a contacting flat face that is provided at the tip of the tip portion to make area contact with the subject surface;

(b) a first oblique face that is provided at one end of the contacting flat face such that the angle between the first oblique face and the contacting flat face is at least 90 degrees and at most 170 degrees;

(c) a corner portion that is provided between the first oblique face and the contacting flat face and that is rounded with a first radius of curvature;

(d) a second oblique face that is provided at the other end of the contacting flat face such that the angle between the second oblique face and the contacting flat face is at least 90 degrees and at most 170 degrees; and (e) another corner portion that is provided between the second oblique face and the contacting flat face and that is rounded with a second radius of curvature larger than the first radius of curvature.

In the first contact probe, the tip portion, the supporting portion, and the spring portion are structured such that when the supporting portion is fixed to an inspecting apparatus and when the contacting flat face is pressed against the subject surface, the elastic deformation of the spring portion produced by the pressing force can move the tip portion with the first oblique face in the lead maintaining the contact between the contacting flat face and the subject surface. In this structure, the side opposite to the side that moves in the lead during the scrubbing by the pressing force has a corner portion with a radius of curvature larger than that of the corner portion at the opposite side. Consequently, this structure enables the production of a contact probe that can sufficiently shave the subject surface during the scrubbing by the pressing force so as to secure the contact and that can reduce the amount of shavings during the scrubbing while the contact probe dissociates from the subject surface. Therefore, the contact probe can reduce the amount of shavings adhering to the tip portion and decrease the formation of scratches on the subject surface.

In the first contact probe, the second radius of curvature may be at least two times the first radius of curvature. This structure enables the production of a contact probe that effectively reduces the amount of shavings during the scrubbing while the contact probe dissociates from the subject surface. Therefore, the amount of shavings adhering to the tip portion can be reduced. As a result, the formation of scratches on the subject surface can be reduced.

In the first contact probe, the first radius of curvature may be at least 0.1 µm and at most 5 µm. This structure enables the production of a contact probe that adequately shaves the subject surface during the scrubbing by the pressing force and effectively reduces the amount of shavings during the scrubbing while the contact probe dissociates from the subject surface.

To attain the above-described object, another contact probe (referred to as a second contact probe in this section of "Disclosure of the Invention") in accordance with another aspect of the present invention comprises:

(a) a tip portion that makes contact with a subject surface;

(b) a supporting portion that supports the other portions and performs electrical connection; and (c) a spring portion that connects the tip portion to the supporting portion.

The tip portion of the second contact probe comprises:

(a) a first corner portion that is provided at one side of the tip portion (hereinafter referred to as the first side) and that is rounded with a first radius of curvature; and (b) a second corner portion that is provided at the opposite side of the tip portion (hereinafter referred to as the second side), that is connected to the first corner portion at a connecting point at the tip of the tip portion, and that is rounded with a second radius of curvature different from the first radius of curvature.

In the second contact probe, the tip portion, the supporting portion, and the spring portion are structured such that when the supporting portion is fixed to an inspecting apparatus and when the tip portion is pressed against the subject surface, the elastic deformation of the spring portion produced by the pressing force can move the tip portion with the first side in the lead maintaining the contact between the tip portion and the subject surface. This structure enables the production of a contact probe that removes the surface layer of the subject surface during one of the two scrubbing actions (one is the scrubbing by pressing the tip portion against the subject surface and the other is the scrubbing during the dissociation from the subject surface) so as to secure the electrical contact and that reduces the amount of the removal of the surface layer during the other scrubbing action.

In the second contact probe, the second radius of curvature may be larger than the first radius of curvature. This structure enables the production of a contact probe that sufficiently removes the surface layer of the subject surface during the scrubbing by the pressing force and reduces the amount of removal during the scrubbing at the time of the dissociation.

In the second contact probe, the first side may be provided with a suppressing portion adjacent to the first corner portion. The suppressing portion presses against the subject surface a bulging portion produced by the first corner portion. (If the bulging portion grows and peels, it becomes a shaving.) This structure enables the prevention of the growth of the bulging portion produced by the first corner portion while the electrical contact is secured with the first corner portion. Consequently, the problem caused by the adherence of the shavings can be solved.

In the second contact probe, the suppressing portion at the first side may comprise at least one suppressing face that is opposed to the subject surface. This structure enables the suppressing face to repel the bulging portion toward the subject surface even when the direction of the growth of the bulging portion varies to some extent. In other words, this simple structure enables reliable suppression of the growth of the bulging portion.

In the second contact probe, the suppressing portion at the first side may comprise a plurality of the foregoing suppressing faces that are connected in the form of a step-wise structure. This structure enables one of the suppressing faces to function even when the initial inclination of the tip portion toward the first side is large to some degree. In other words, this structure enables the production of a contact probe that suppresses the adverse effects caused by the variation of the initial inclination of the tip portion.

The second contact probe may have the following features:

(a) the first radius of curvature is larger than the second radius of curvature;

(b) the second side is provided with a suppressing portion adjacent to the second corner portion; and (c) the suppressing portion presses a bulging portion produced by the second corner portion against the subject surface.

This structure enables the contact probe to secure the electrical contact by the scrubbing at the time of the dissociation of the tip portion from the subject surface, rather than by the scrubbing at the time of pressing the tip portion against the subject surface. The contact probe can suppress the growth of the bulging portion during the scrubbing at the time of the dissociation from the subject surface.

In the second contact probe, the suppressing portion at the second side may comprise a suppressing face that is opposed to the subject surface. In this structure, the bulging portion produced during the scrubbing at the time of the dissociation from the subject surface can be repelled toward the subject surface by the suppressing face. In other words, this simple structure enables reliable suppression of the growth of the bulging portion.

To attain the above-described object, yet another contact probe (referred to as a third contact probe in this section of "Disclosure of the Invention") in accordance with yet another aspect of the present invention comprises a tip portion for making contact with a ball-shaped electrode of a subject to be measured. The tip portion is provided at its tip with a recess for allowing the ball-shaped electrode to come into the recess so that the tip portion can make contact with the ball-shaped electrode. The recess is provided with:
  (a) a bottom that limits the movement of the tip portion toward the ball-shaped electrode by making contact with the ball-shaped electrode;
  (b) two oblique side walls; and
  (c) at least one protrusion that protrudes from one of the oblique side walls to scratch the ball-shaped electrode so that the contact with the ball-shaped electrode can be attained.

This structure enables the production of a contact probe that secures the electrical continuity needed for the measurement, because the protrusion or each protrusion bites the side portion of a ball-shaped electrode, such as one used in a BGA package, to remove the insulating layer on the surface of the electrode when the contact probe is pressed against the ball-shaped electrode. In this case, the bottom of the recess makes contact with the lowermost portion of the ball-shaped electrode so as to prevent the protrusion or each protrusion from excessively biting the electrode. As a result, the contact probe can avoid the short-circuiting between the neighboring electrodes due to an excessive burr. The contact probe can also avoid the locking of the protrusion or each protrusion in the electrode due to an excessive bite.

In the third contact probe, the protrusion or each protrusion may be provided at a position shifted to the side by an angle of at least 45 degrees and at most 90 degrees from the direction viewed from point O toward point A, where point O is the center of the opening of the recess, and point A is the center of the bottom of the recess. This structure enables the production of a contact probe that can scrub only a proper distance on the ball-shaped electrode, thereby preventing the popcorn phenomenon.

In the third contact probe, the protrusion or each protrusion may have a height (from the root to the pointed end) of at most ¼ the radius of the ball-shaped electrode. In this structure, the depth of the bite by the protrusion or each protrusion into the ball-shaped electrode can be limited to a specified degree. As a result, this structure can avoid the short-circuiting between the neighboring electrodes due to an excessive burr.

In the third contact probe, the contact probe may further comprise:
  (a) a supporting portion that supports the other portions and performs electrical connection; and
  (b) a spring portion that connects the tip portion to the supporting portion.

In this case, the tip portion, the supporting portion, and the spring portion may be formed as a unitary structure. This structure enables the contact probe to be produced easily by the LIGA process with high precision.

BEST MODE FOR CARRYING OUT THE INVENTION

Figure 18:
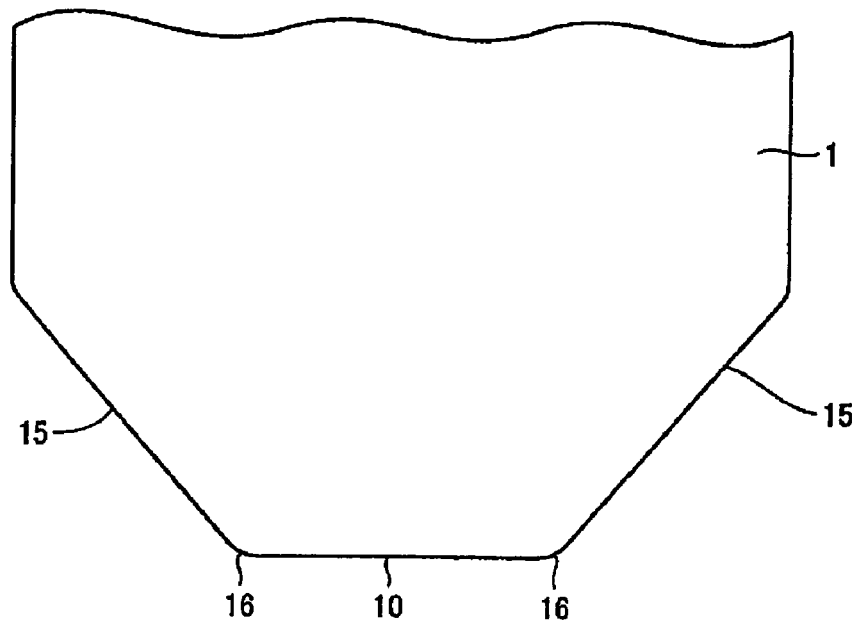
FIG. 18 is a further enlarged plan view showing a tip portion of the contact probe according to the prior art.

FIG. 18 is an enlarged view of the tip portion 1 of a conventional contact probe. The boundary between the contacting flat face 10 and the oblique face 15 at each end of the contacting flat face 10 forms a corner portion 16. In the conventional contact probe, the shape and size of the corner portion 16 are determined without paying much attention. The corner portions 16 are symmetrically formed without regard to the moving direction for the scrubbing when the tip portion 1 is pressed against the subject surface. On the other hand, the present inventors carefully considered the size of the corner portion and accomplished the present invention.

EMBODIMENT 1

(Structure)

Figure 1:
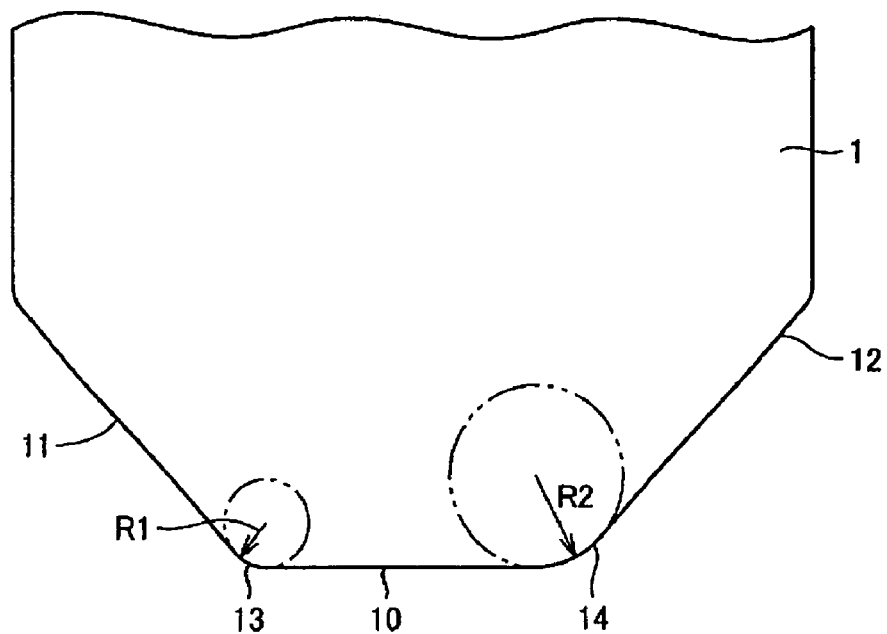
FIG. 1 is an enlarged plan view showing a tip portion of a first example of the contact probe in Embodiment 1 according to the present invention.

A contact probe in Embodiment 1 according to the present invention is explained below by referring to FIG. 1. FIG. 1 is an enlarged view of the tip portion 1. In the contact probe, a first oblique face 11 refers to an oblique face that moves in the lead when the tip portion 1 moves for performing the scrubbing by the force pressing the contact probe against the subject surface. As shown in FIG. 1, the first oblique face 11 is located at the left hand side of the contacting flat face 10. The opposite oblique face is referred to as a second oblique face 12. A corner portion 13 through which one end of the contacting flat face 10 is connected to the first oblique face 11 has a radius of curvature different from that of a corner portion 14 through which the other end of the contacting flat face 10 is connected to the second oblique face 12. As can be seen from FIG. 1, the corner portion 14 has the radius of curvature R2 larger than the radius of curvature R1 of the corner portion 13.

(Function and Effect)

As explained above, the side opposite to the side that performs the scrubbing by the pressing force has a corner portion with a radius of curvature larger than that of the corner portion at the other side. Consequently, when the contact probe is used, the subject surface can be sufficiently shaved during the scrubbing by the pressing force so as to secure the electrical continuity, and the amount of shavings can be reduced during the scrubbing while the contact probe dissociates from the subject surface. Therefore, the amount of shavings adhering to the tip portion can be reduced. As a result, this structure can increase the number of times the contact probe can be used continuously without cleaning.

As mentioned above, the formation of scratches can be suppressed during the scrubbing while the contact probe dissociates from the subject surface. Therefore, this structure can reduce the extent of the scratches formed on the surface of the electrode in each measurement, thereby reducing the number of occurrences of unsatisfactory connection in the subsequent bonding step.

Figure 2:
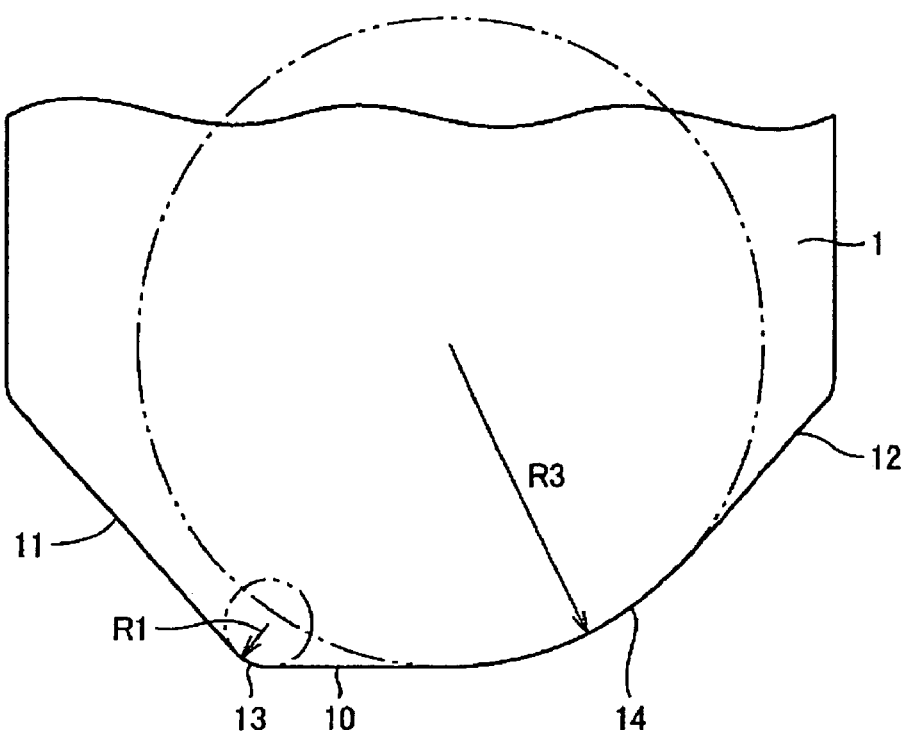
FIG. 2 is an enlarged plan view showing a tip portion of a second example of the contact probe in Embodiment 1 according to the present invention.
Figure 3:
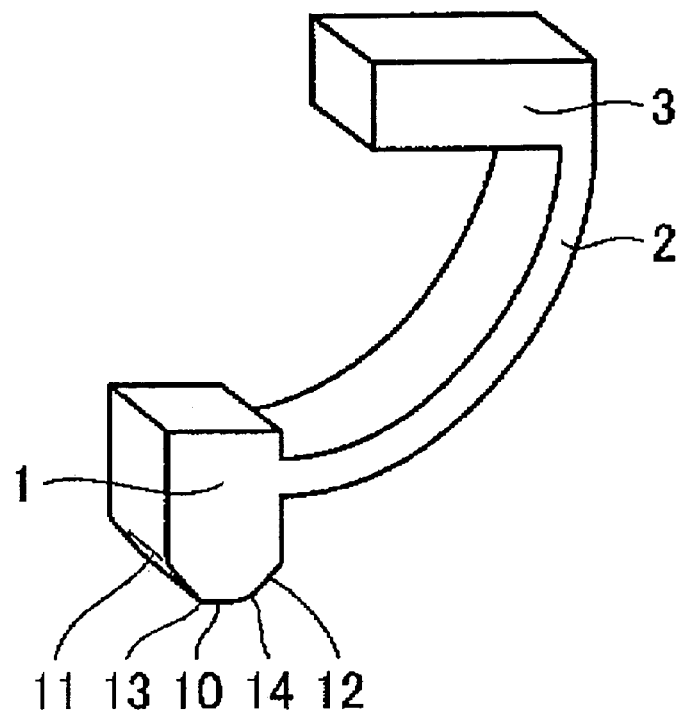
FIG. 3 is a perspective view showing the second example of the contact probe in Embodiment 1 according to the present invention.

Although the difference in radius of curvature shown in FIG. 1 exercises some effects, the difference can be increased. FIG. 2 shows an example in which the difference is increased. FIG. 3 shows an overview of the contact probe having the foregoing tip portion 1. An increased difference as shown in FIG. 2 increases the effect of reduction in the amount of adhering shavings and the formation of scratches during the scrubbing at the time of the dissociation. The present inventors found that the effect is increased when the radius of curvature of the corner portion 14 is at least two times that of the corner portion 13. Furthermore, when R1 is at least 0.1 μm and at most 5 μm, the effect is obvious. In particular, when R1 is at least 0.5 μm and at most 3 μm, the effect is more obvious. When an angle produced by each of the corner portions 13 and 14 is at least 90 degrees and at most 170 degrees, the effect is sufficient. If the angle is larger than 170 degrees, the shavings tend to accumulate between the tip portion and the subject surface, thereby decreasing the reliability.

The angles produced by the corner portions 13 and 14 may be either the same or different. The contact probe can be produced by the LIGA process as a unitary structure. Consequently, the radius of curvature and the angle at the corner portions of the tip portion can be freely adjusted by changing the mask pattern.

EMBODIMENT 2

(Structure)

Figure 4:
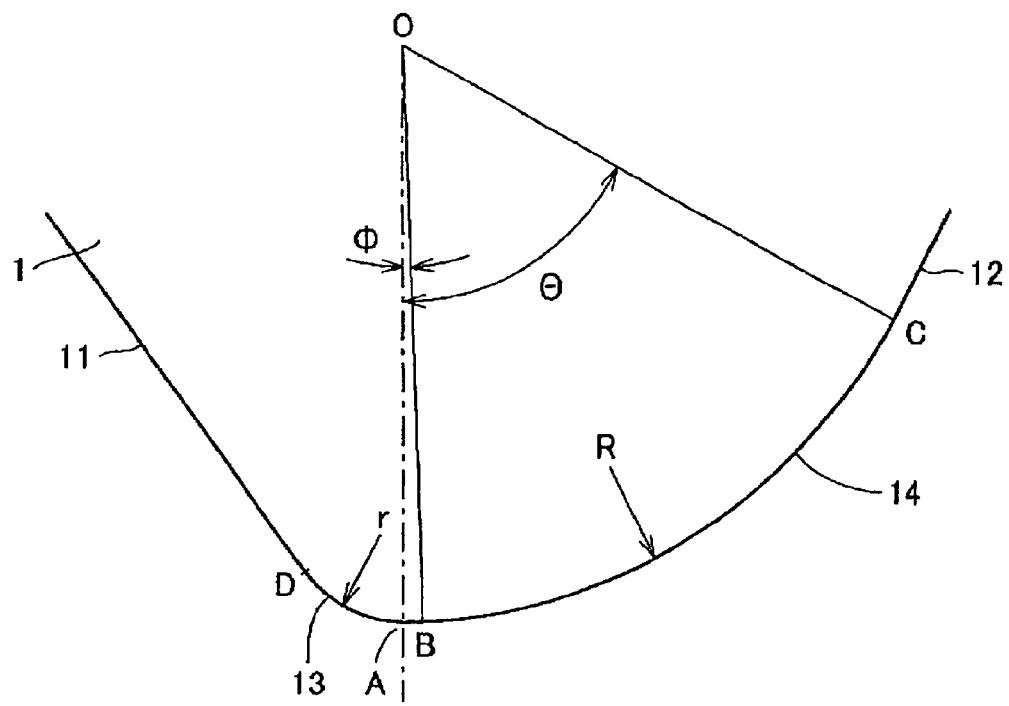
FIG. 4 is an enlarged plan view showing a tip portion of the contact probe in Embodiment 2 according to the present invention.

A contact probe in Embodiment 2 according to the present invention is explained below by referring to FIG. 4. FIG. 4 is an enlarged view of the tip portion 1. During the scrubbing by pressing the contact probe against the subject surface, the tip portion 1 moves to the left in FIG. 4. Hereinafter, the side that moves in the lead in this direction is referred to as "the first side," and the opposite side (right hand side in FIG. 4) is referred to as "the second side." Therefore, the second side represents the side that moves in the lead during the scrubbing at the time of the dissociation of the contact probe from the subject surface.

As shown in FIG. 4, the tip portion 1 of the contact probe has no contacting flat face 10 described in Embodiment 1 (see FIGS. 1 and 2). The tip portion 1 has a corner portion 13 (from point B to point D) as a first corner portion at the first side and a corner portion 14 (from point B to point C) as a second corner portion at the second side. The two corner portions are connected at point B.

The corner portions 13 and 14 have a different radius of curvature. The corner portion 13 has the radius of curvature r, and the corner portion 14 has the radius of curvature R. As can be seen from FIG. 4, R is greater than r. The magnitude of R is determined so as not to produce shavings at the intended contacting force, and the magnitude of r is determined so as to secure electrical contact by shaving the subject surface at the intended contacting force. The center of the curvature of the corner portion 14 is expressed as point O. A first oblique face 11 is connected to the corner portion 13 at point D, and a second oblique face 12 is connected to the corner portion 14 at point C.

In this contact probe, the nearest point to the subject surface before making contact with the subject surface is referred to as the initial lowermost point A. The initial lowermost point A lies at some midpoint in the corner portion 13, i.e., somewhere between the connecting point B and point D. When the supporting portion 3 is fixed to an inspecting apparatus and when the contact probe descends vertically toward the subject surface, the initial lowermost point A first makes contact with the subject surface. Then, the elastic deformation of the spring portion 2 slants the entire tip portion 1 in a clockwise direction in FIG. 4. As a result, the center of the contact of the tip portion 1 with the subject surface shifts to a pressurized lowermost point that is slightly away from the initial lowermost point A to the right. Under this condition, the tip portion 1 moves with the first side in the lead (to the left in FIG. 4) maintaining the contact with the subject surface, performing the scrubbing.

It is desirable that the pressurized lowermost point be coincident with the connecting point B. More specifically, it is desirable that the magnitude, Φ, of the angle AOB be equal to the angle of inclination of the tip portion 1 when the intended contacting force against the subject surface is attained. The reason is that when the pressurized lowermost point is coincident with the connecting point B, the entire corner portion 13 shaves the subject surface during the scrubbing by pressing the contact probe against the subject surface, thereby contributing to the securing of the required electrical contact.

However, the angle of inclination of the tip portion 1 may vary in reality. Taking the variation into account, it is desirable that the pressurized lower-most point lie in the range from the connecting point B to point C inclusive. More specifically, the magnitude, Θ, of the angle AOC must be larger than the maximum angle of inclination of the tip portion 1 when the supporting portion 3 is brought to the nearest position to the subject surface, i.e., when the spring portion 2 is elastically deformed to the maximum. The reason is that if the tip portion 1 is inclined at an angle larger than Θ by the force pressing it against the subject surface, the oblique face 12 makes contact with the subject surface.

As a result, the electrical contact cannot be secured because the subject surface cannot be shaved properly.

(Function and Effect)

As explained above, Embodiment 2 can attain an effect similar to that attained in Embodiment 1, because the side opposite to the side that performs the scrubbing by the pressing force has a corner portion with a radius of curvature larger than that of the corner portion at the opposite side.

EMBODIMENT 3

(Structure)

Figure 5:
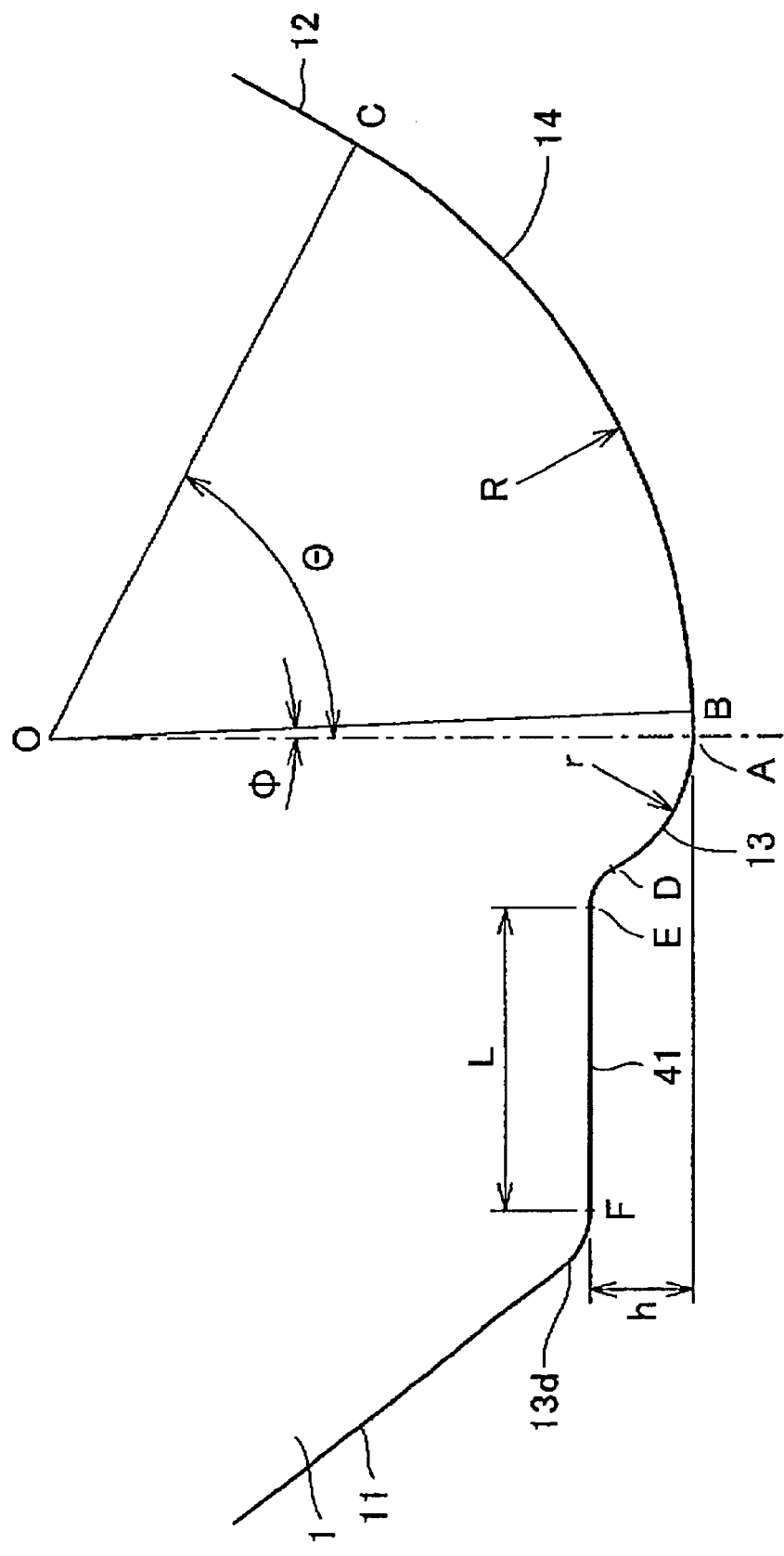
FIG. 5 is an enlarged plan view showing a tip portion of the contact probe in Embodiment 3 according to the present invention.

A contact probe in Embodiment 3 according to the present invention is explained below by referring to FIG. 5. FIG. 5 is an enlarged view of the tip portion 1. As with the contact probe explained in Embodiment 2, this contact probe has the lowermost point A, a connecting point B, a corner portion 13 as a first corner portion, a corner portion 14 as a second corner portion, a first oblique face 11, a second oblique face 12, and point O as the center of the curvature of the corner portion 14. However, unlike the contact probe in Embodiment 2, the contact probe in Embodiment 3 has a suppressing portion between the corner portion 13 and the first oblique face 11. The suppressing portion is provided to suppress to the subject surface a bulging portion produced from the subject surface by the corner portion 13. The suppressing portion extends from the corner portion 13 toward the first side and includes a suppressing face 41 (from point E to point F) that is opposed to the subject surface. The height h of the suppressing face from the lowermost point A must not exceed the limit that can prevent the bulging portion from extending to the outside of the suppressing portion. If the height h is excessively large, the bulging portion extends to the outside without being pressed properly against the subject surface. If the height h is excessively small, a problem may be created by the variation of the initial inclination of the tip portion 1 in a counter-clockwise direction. More specifically, if the variation is large to a certain extent, the large initial inclination may cause the corner portion 13*d* between the suppressing face 41 and the first oblique face 11 to make contact with the subject surface and undesirably produce shavings. The height h must be sufficiently large in so that the variation of the initial inclination of the tip portion 1 disallows the corner portion 13*d* to make contact with the subject surface and must be sufficiently small to prevent the bulging portion produced by the corner portion 13 from extending to the outside.

(Function and Effect)

Figure 6:
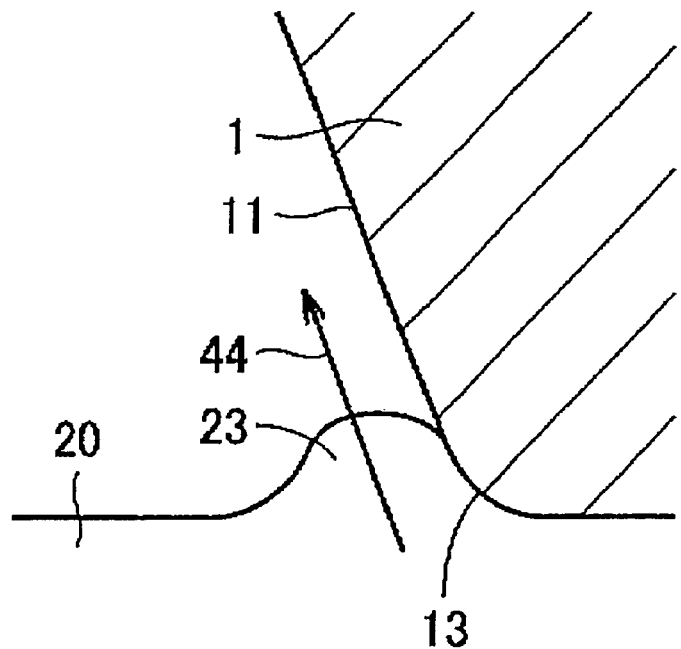
FIG. 6 is a first diagram illustrating a phenomenon occurring in the vicinity of a corner portion having no suppressing portion.
Figure 7:
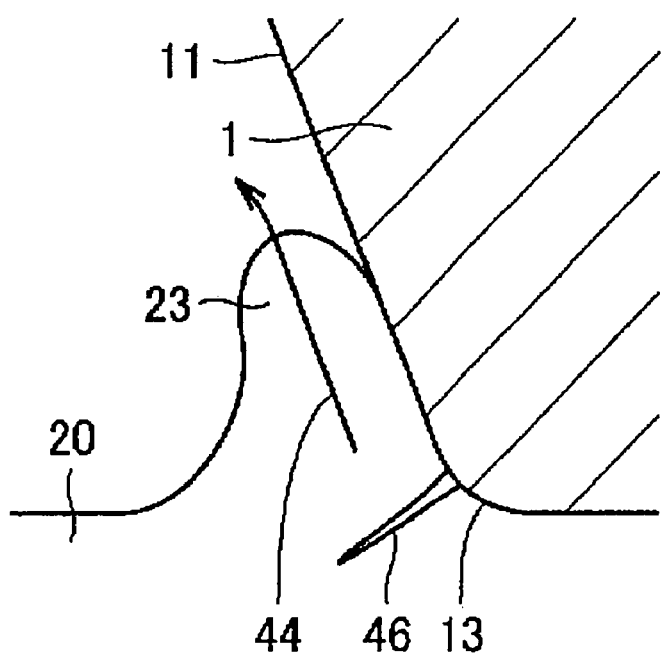
FIG. 7 is a second diagram illustrating the phenomenon occurring in the vicinity of a corner portion having no suppressing portion.
Figure 16:
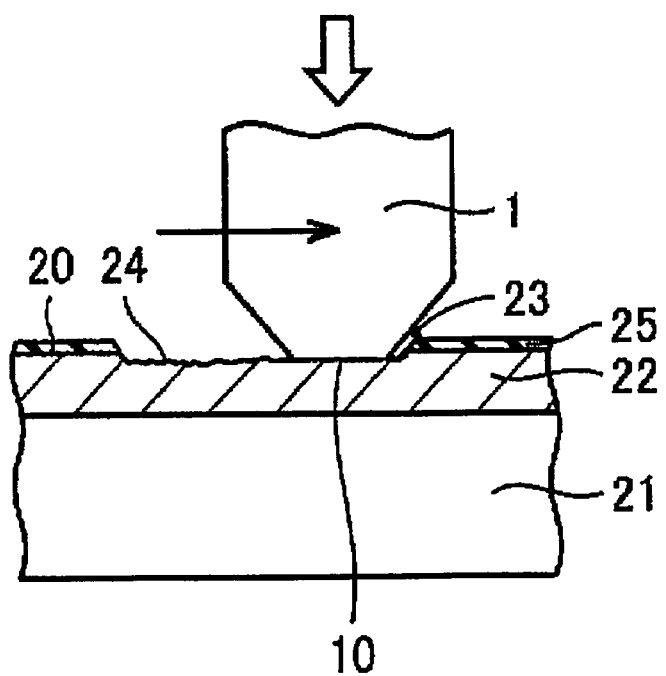
FIG. 16 is a second diagram illustrating the function of the contact probe according to the prior art.
Figure 17:
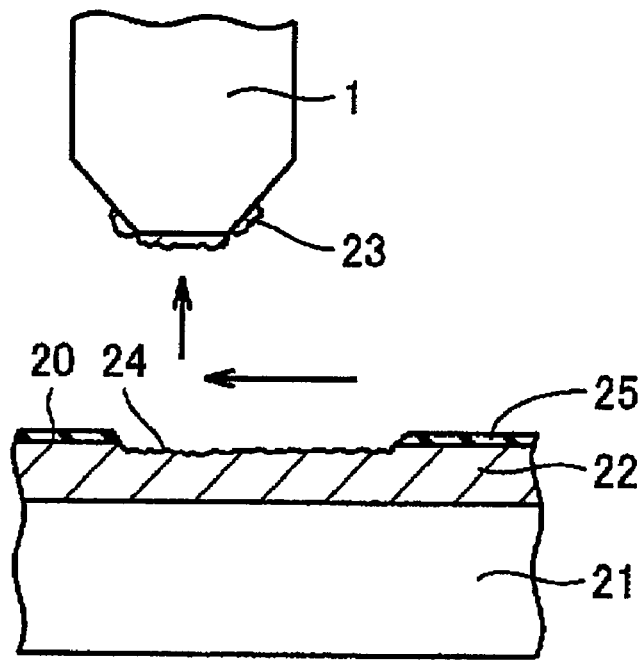
FIG. 17 is a third diagram illustrating the function of the contact probe according to the prior art.

The function of the suppressing portion is explained below by referring to FIGS. 6 to 9. FIGS. 6 and 7 are enlarged views showing the portion in the vicinity of the corner portion 13 when no suppressing portion is provided. First, the tip portion 1 proceeds with the first side in the lead (to the left-hand side in the views) maintaining the contact with the subject surface 20. As shown in FIG. 6, the corner portion 13 scrapes the material in the surface layer of the subject surface 20, forming a bulging portion 23. The bulging portion 23 is squeezed in a direction shown by an arrow 44. As shown in FIG. 7, the bulging portion 23 continues to grow along the first oblique face 11. When the bulging portion 23 grows to a certain limit, the stress concentrated at the bulging portion 23's root portion facing the corner portion 13 reaches a critical point, forming a broken section 46. After the breaking, the bulging portion 23 becomes a shaving and adheres to an undesirable portion of the tip portion 1 like the shavings 23 shown in FIGS. 16 and 17, creating a problem.

Figure 8:
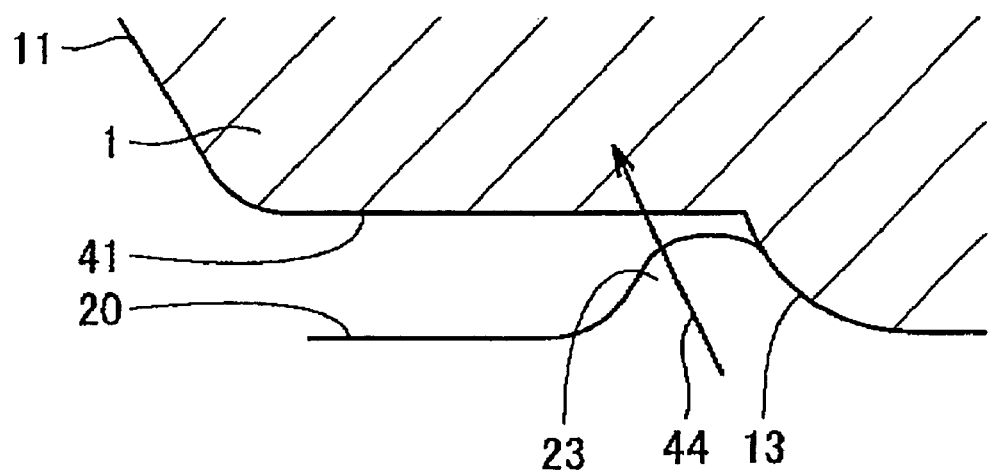
FIG. 8 is a first diagram illustrating a phenomenon occurring in the vicinity of a corner portion having a suppressing portion.
Figure 9:
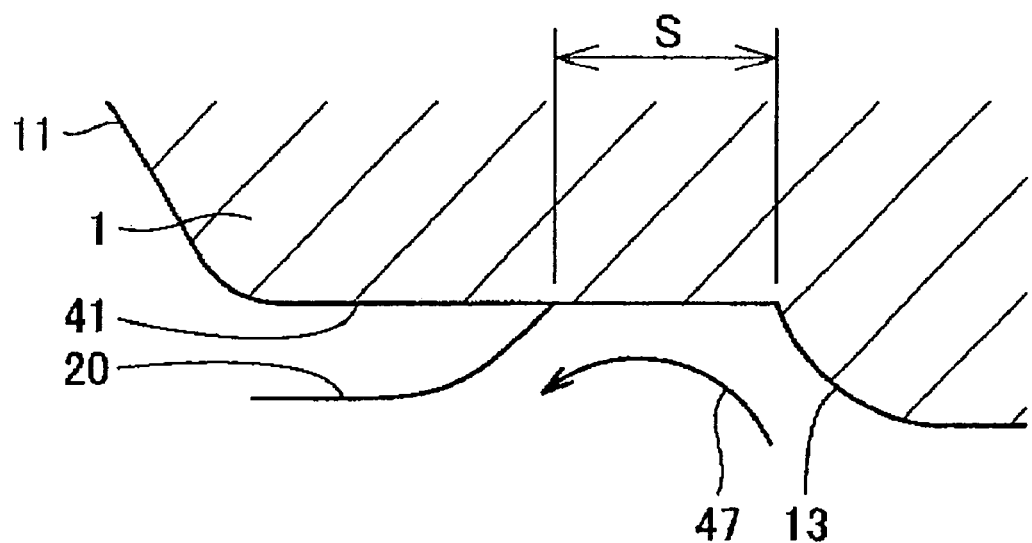
FIG. 9 is a second diagram illustrating the phenomenon occurring in the vicinity of a corner portion having a suppressing portion.

On the other hand, FIGS. 8 and 9 are enlarged views showing the portion in the vicinity of the corner portion 13 when a suppressing portion is provided. First, the tip portion 1 proceeds with the first side in the lead (to the left-hand side in the views) maintaining the contact with the subject surface 20. As shown in FIG. 8, the corner portion 13 scrapes the material in the surface layer of the subject surface 20, forming a bulging portion 23. The bulging portion 23 is first squeezed in a direction shown by an arrow 44. Unlike the case shown in FIGS. 6 and 7, a suppressing face 41 of the suppressing portion is provided so as to be opposed to the subject surface 20 at a position ahead of the growing bulging portion 23. Consequently, the leading end of the bulging portion 23 is blocked by the suppressing face 41 and repelled toward the subject surface 20 as shown by an arrow 47 in FIG. 9. Because the height h of the suppressing face 41 (see FIG. 5) is sufficiently small in order for the bulging portion 23 not to extend to the outside, the bulging portion 23 is pressed against the subject surface 20 without growing further. Because the region S in which the bulging portion 23 makes contact with the tip portion 1 is broadened, the stress is dispersed. Thus, the suppression of the growth of the bulging portion 23 can prevent the bulging portion 23 from adhering to the tip portion 1 as a shaving, thereby avoiding the creation of a problem.

As can be seen from FIG. 5, not only can the contact probe in Embodiment 3 attain the same effect as attained in Embodiment 2 but it can also suppress the growth of a bulging portion because it is provided with the suppressing portion including the suppressing face 41 between the corner portion 13 and the first oblique face 11. As a result, it can solve the hitherto unsolved problem caused by shavings.

EMBODIMENT 4

(Structure)

Figure 10:
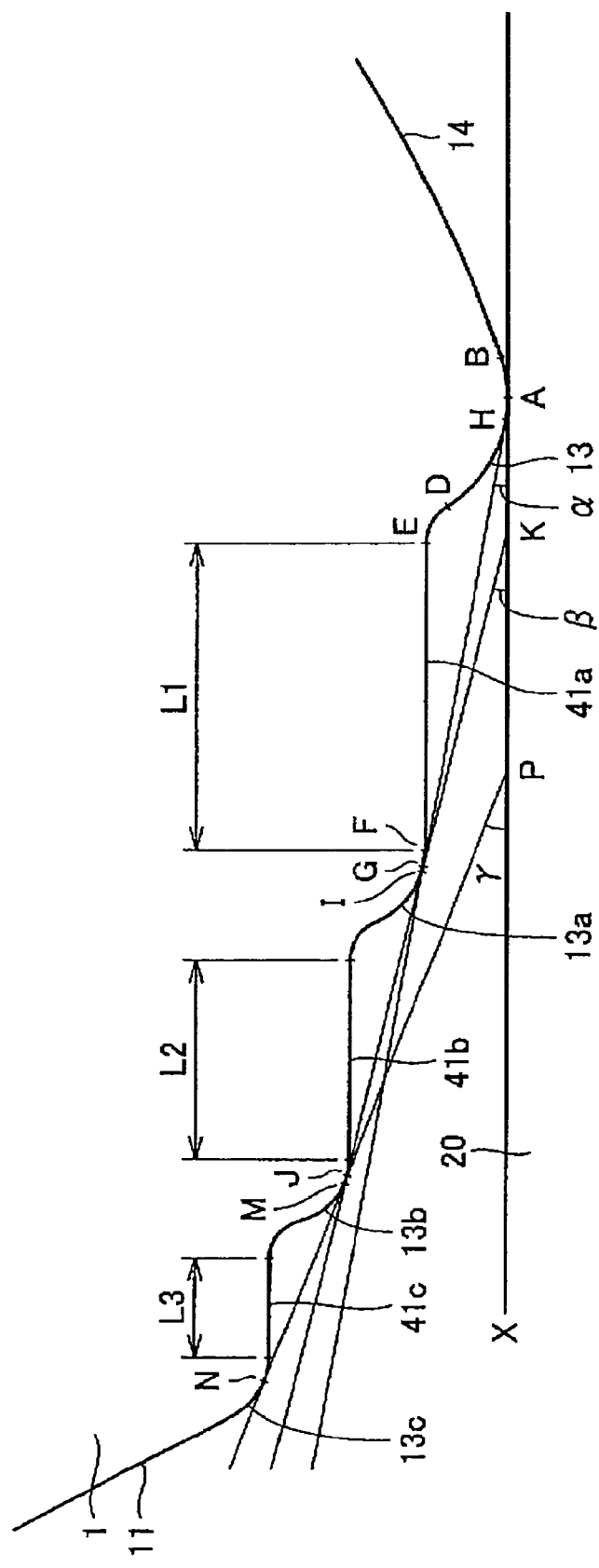
FIG. 10 is an enlarged plan view showing a tip portion of the contact probe in Embodiment 4 according to the present invention.

A contact probe in Embodiment 4 according to the present invention is explained below by referring to FIG. 10. FIG. 10 is an enlarged view of the tip portion 1. As with the contact probe explained in Embodiment 3, this contact probe has the lowermost point A, a connecting point B, a corner portion 13 as a first corner portion, a corner portion 14 as a second corner portion, a first oblique face 11, a second oblique face 12, and point O as the center of the curvature of the corner portion 14. Furthermore, it has a suppressing portion between the corner portion 13 and the first oblique face 11. However, unlike the contact probe in Embodiment 3, whose suppressing portion includes only one suppressing face, 41, the contact probe in Embodiment 4 has a suppressing portion including a plurality of suppressing faces, 41a, 41b, and 41c, which are connected in the form of a step-wise structure. A corner portion 13a is provided between the suppressing faces 41a and 41b, and a corner portion 13b between the suppressing faces 41b and 41c. A corner portion 13c is provided between the suppressing face 41c and the first oblique face 11. The suppressing faces 41a, 41b, and 41c have a length of L1, L2, and L3, respectively. Their relationship is expressed as L1>L2>L3.

Although the suppressing portion includes three suppressing faces in this case, the number of suppressing faces may be changed.

(Function and Effect)

A structure having a plurality of suppressing faces as described above can produce a contact probe that not only has the effects attained in Embodiment 3 but also suppresses the adverse effects caused by the variation of the initial inclination of the tip portion. This process is explained below by referring to FIG. 10.

In an ideal state, the initial inclination of the tip portion 1 is zero, and the subject surface 20 first makes contact with the tip portion 1 at the lowermost point A in a posture indicated by the line AX. After the pressing force inclines the tip portion 1 slightly in a clockwise direction, the corner portion 13 scrapes the subject surface 20. While the suppressing face 41a suppresses the growth of the bulging portion, the tip portion 1 moves with the first side in the lead (to the left-hand side in FIG. 10).

In FIG. 10, the line HG is a tangent common to the corner portions 13 and 13a, and α denotes an angle produced by the lines HG and AX. The line IJ is a tangent common to the corner portions 13a and 13b, and β denotes an angle produced by the lines IJ and AX. The line MN is a tangent common to the corner portions 13b and 13c, and γ denotes an angle produced by the lines MN and AX.

If the initial inclination of the tip portion 1 in a counter-clockwise direction is smaller than α, the subject surface 20 makes no contact with the corner portion 13a. Consequently, the corner portion 13 scrapes the subject surface 20, and the suppressing face 41a can suppress the growth of the bulging portion.

If the initial inclination of the tip portion 1 in a counter-clockwise direction is α or more and less than β, the subject surface 20 makes contact with the corner portion 13a without making contact with the corner portion 13b. Consequently, the corner portion 13a scrapes the subject surface 20, and the suppressing face 41b can suppress the growth of the bulging portion.

If the initial inclination of the tip portion 1 in a counter-clockwise direction is β or more and less than γ, the subject surface 20 makes contact with the corner portion 13b without making contact with the corner portion 13c. Consequently, the corner portion 13b scrapes the subject surface 20, and the suppressing face 41c can suppress the growth of the bulging portion.

If the initial inclination of the tip portion 1 in a counter-clockwise direction is γ or more, the subject surface 20 makes contact with the corner portion 13c. Consequently, the corner portion 13c scrapes the subject surface 20, and the growth of the bulging portion cannot be suppressed.

As explained above, when the suppressing portion has only one suppressing face, 41a, the growth of the bulging portion can be suppressed only when the angle of the initial inclination of the tip portion 1 in a counterclockwise direction is less than α. On the other hand, when the suppressing portion has three suppressing faces, the angle that enables the suppression of the growth of the bulging portion can be extended to γ. In other words, an increase in the number of suppressing faces by forming a step-wise structure enables the production of a contact probe that more effectively suppresses the adverse effects caused by the variation of the initial inclination of a tip portion in a counter-clockwise direction.

EMBODIMENT 5

(Structure)

Figure 11:
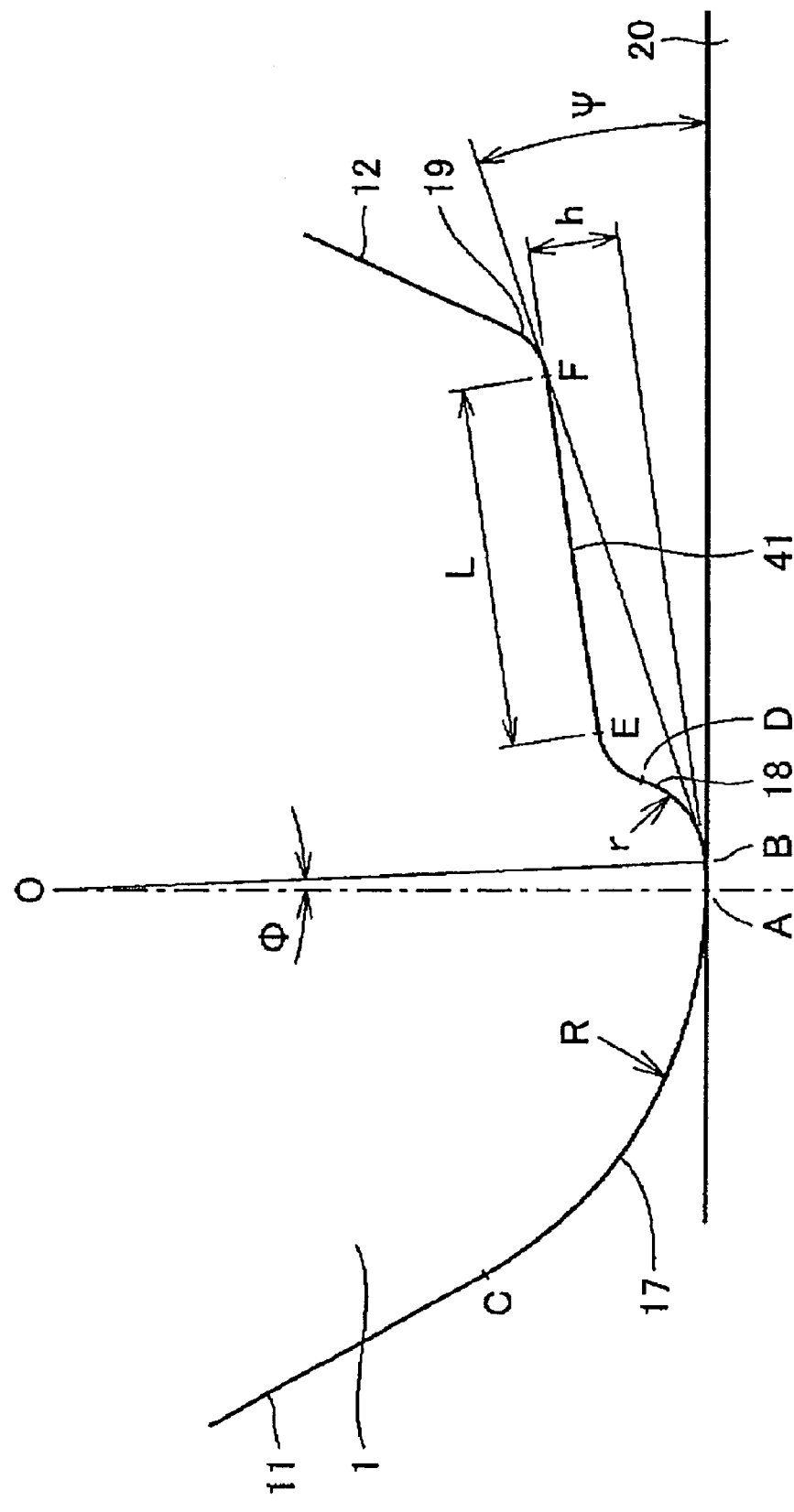
FIG. 11 is an enlarged plan view showing a tip portion of the contact probe in Embodiment 5 according to the present invention.
Figure 12:
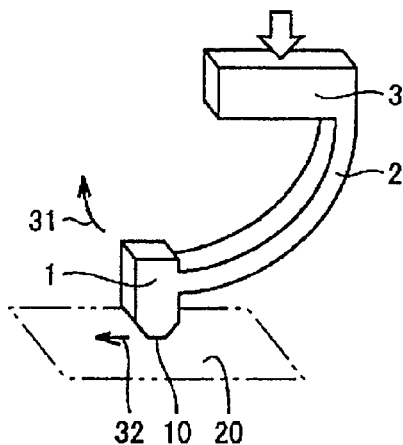
FIG. 12 is a diagram illustrating a first example of the contact probe according to the prior art.
Figure 13:
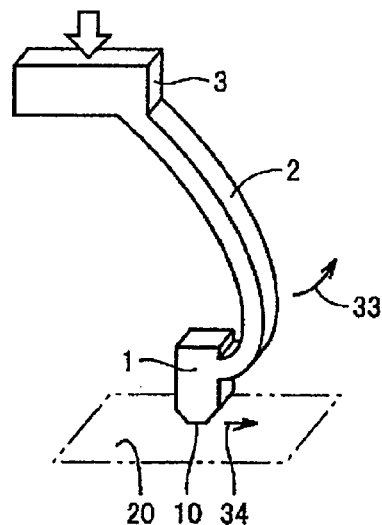
FIG. 13 is a diagram illustrating a second example of the contact probe according to the prior art.
Figure 14:
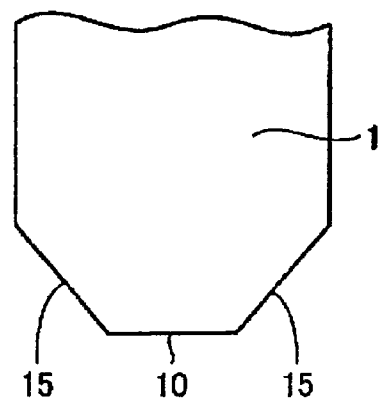
FIG. 14 is an enlarged plan view showing a tip portion of the contact probe according to the prior art.
Figure 15:
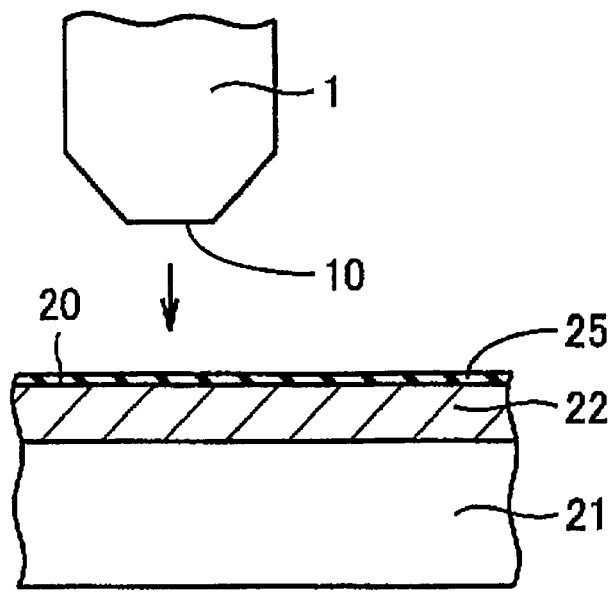
FIG. 15 is a first diagram illustrating the function of the contact probe according to the prior art.

A contact probe in Embodiment 5 according to the present invention is explained below by referring to FIG. 11. FIG. 11 is an enlarged view of the tip portion 1. This contact probe also moves to the left in FIG. 11 with "the first side" in the lead during the scrubbing by pressing the contact probe against the subject surface. It moves to the right in FIG. 11 with "the second side" in the lead during the scrubbing at the time of the dissociation of the contact probe from the subject surface. This contact probe is devised to secure the electrical contact during the scrubbing at the time of the dissociation from the subject surface rather than during the scrubbing at the time of pressing the contact probe against the subject surface.

This contact probe has the tip portion 1 provided with a corner portion 17 (from point B to point C) as a first corner portion existing in the first side and a corner portion 18 (from point B to point D) as a second corner portion existing in the second side. The corner portions 17 and 18 are connected with each other at the connecting point B.

The corner portions 17 and 18 have a different radius of curvature. The corner portion 17 has the radius of curvature R, and the corner portion 18 has the radius of curvature r. As can be seen from FIG. 11, R is greater than r. The center of the curvature of the corner portion 17 is expressed as point O. A first oblique face 11 is connected to the corner portion 17 at point C, and a second oblique face 12 is connected to a corner portion 19. A suppressing face 41 is provided between the corner portion 19 and point D at the end of the corner portion 18.

In this contact probe, the nearest point to the subject surface before making contact with the subject surface is referred to as the initial lowermost point A. The initial lowermost point A lies at some midpoint in the corner portion 17, i.e., somewhere between the connecting point B and point C. When the supporting portion 3 is fixed to an inspecting apparatus and when the contact probe descends vertically toward the subject surface, the initial lowermost point A first makes contact with the subject surface. Then, the elastic deformation of the spring portion 2 slants the entire tip portion 1 in a clockwise direction in FIG. 11. As a result, the center of the contact of the tip portion 1 with the subject surface shifts to the pressurized lowermost point that is slightly away from the initial lowermost point A to the right. Under this condition, the tip portion 1 moves with the first side in the lead (to the left in FIG. 11) maintaining the contact with the subject surface, performing the scrubbing. However, the corner portion 17 having the radius of curvature R produces no shavings.

On the other hand, when the contact probe dissociates from the subject surface 20, the tip portion 1 moves with the second side in the lead (to the right in FIG. 11) scraping the subject surface 20 with the corner portion 18. As described above, the suppressing face 41 is provided in the second side at the right of the corner portion 18. A bulging portion produced by the corner portion 18 is pressed against the subject surface 20 by the suppressing face 41, and its growth is suppressed. The height h of the suppressing face 41 from the connecting point B must not exceed the limit that can prevent the bulging portion from extending to the outside of the suppressing portion. If the height h is excessively large, the bulging portion extends to the outside without being pressed properly against the subject surface.

An angle, $\Psi$, is produced by two lines; one is a tangent common to the corner portions 18 and 19 and the other is the subject surface 20 when it first makes contact with the corner portion 17 at the lowermost point A. The angle $\Psi$ must be larger than the maximum angle of inclination of the tip portion 1 when the supporting portion 3 is brought to the nearest position to the subject surface, i.e., when the spring portion 2 is elastically deformed to the maximum. The reason is that if the tip portion 1 is inclined at an angle larger than $\Psi$ by the force pressing it against the subject surface 20, the corner portion 19 makes contact with the subject surface 20, scraping the subject surface 20.

It is desirable that the pressurized lowermost point be coincident with the connecting point B. More specifically, it is desirable that the magnitude, $\Phi$, of the angle AOB be equal to the angle of inclination of the tip portion 1 when the intended contacting force against the subject surface is attained. The reason is that when the pressurized lowermost point is coincident with the connecting point B, the scrubbing at the time of the dissociation of the contact probe from the subject surface can be started in the state that allows the entire corner portion 18 to scrape the subject surface. This condition is advantageous in securing the required electrical contact.

(Function and Effect)

As explained above, the structure in Embodiment 5 enables the production of a contact probe that not only secures the electrical contact during the scrubbing at the time of the dissociation from the subject surface rather than during the scrubbing at the time of pressing the contact probe against the subject surface but also suppresses the growth of the bulging portion during the scrubbing at the time of the dissociation.

Embodiments 2 to 5 are explained above for a structure in which the first corner and the second corner are connected by the connecting point B rather than by the contacting flat face 10 explained in Embodiment 1 (see FIG. 1). Notwithstanding the foregoing explanations, the contacting flat face 10 may be employed in place of the connecting point B without changing the concept of Embodiments 2 to 5.

EMBODIMENT 6

(Structure)

Figure 19:
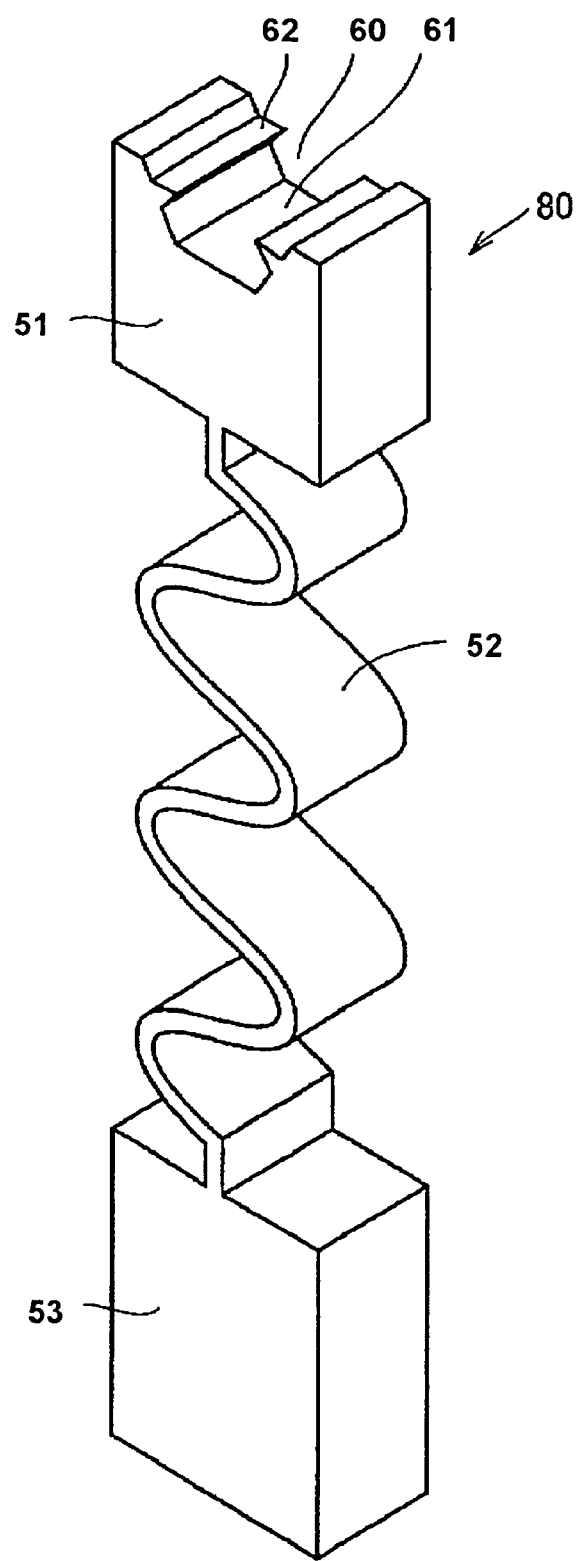
FIG. 19 is a perspective view showing a first contact probe in Embodiment 6 according to the present invention.

A contact probe in Embodiment 6 according to the present invention is explained below by referring to FIGS. 19 and 20. As shown in FIG. 19, a contact probe 80 comprises a tip portion 51, a spring portion 52, and a supporting portion 53. The tip portion 51 is provided to make contact with a subject having a ball-shaped electrode such as a solder ball. The shape of the tip portion 51 is explained in detail below. The tip portion 51 is connected to the supporting portion 53 through the spring portion 52. The contact probe 80 is formed as a unitary structure by the lithographie galvanoformung abformung (LIGA) process. The LIGA process for producing a contact probe is explained, for example, in the published Japanese patent application Tokukai 2001-343397. According to the process, a contact probe is produced by the following process. A resist layer is formed on the surface of a substrate. The resist layer is processed so as to have an intended pattern by lithography. A metal layer is formed by plating at the area where the resist layer is removed. Finally, the metal-layer portion is separated from the other portions to obtain the contact probe. When produced by this process, the contact probe has a shape in which a specified planar pattern has nearly uniform thickness, as shown in FIG. 19. Consequently, the contact probe thus produced has the tip portion 51 and the supporting portion 53 both basically in the shape of a rectangular solid rather than a cylindrical column conventionally produced by machining.

Figure 20:
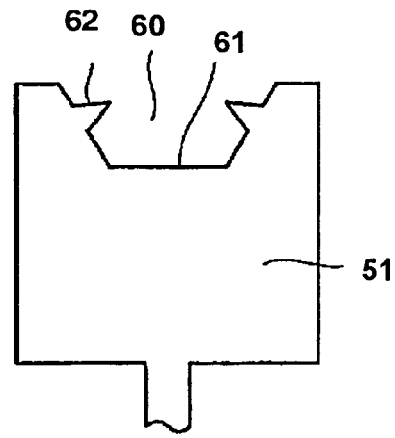
FIG. 20 is an enlarged plan view showing a tip portion of the first contact probe in Embodiment 6 according to the present invention.

FIG. 20 is an enlarged plan view showing the tip portion 51 of the contact probe 80 shown in FIG. 19. The tip portion 51 has a recess 60 at its tip. The recess 60 has the shape of an inverted isosceles trapezoid with a flat bottom 61 at the innermost portion. The bottom 61 is provided to make contact with the ball-shaped electrode of the subject to be measured so that the movement of the tip portion 51 toward the electrode can be limited. In other words, the bottom 61 acts as a stopper. A claw 62 protrudes from each oblique side wall of the recess 60. The claws 62 can be formed as part of the unitary structure when the contact probe 80 is formed by the LIGA process.

(Function and Effect)

Figure 21:
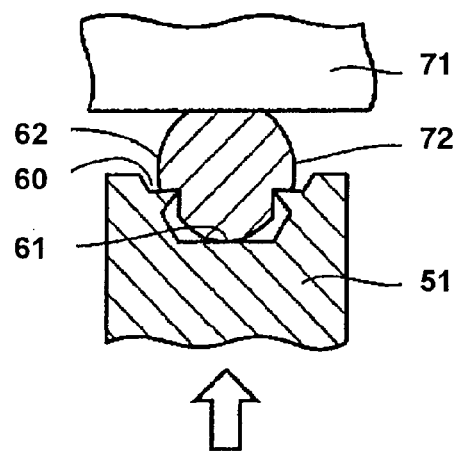
FIG. 21 is a cross-sectional view showing a situation in which a measurement is conducted through a solder ball by using the first contact probe in Embodiment 6 according to the present invention.

The function of the contact probe 80 is explained below by referring to FIG. 21. FIG. 21 shows a situation in which the contact probe 80 makes electrical contact with a solder ball 72 as a ball-shaped electrode placed on the undersurface of a BGA substrate 71. When the tip portion 51 is pressed in a direction shown by an arrow, the recess 60 allows the entry of the solder ball 72, causing the claws 62 to bite the solder ball 72. In this case, the movement of the solder ball 72 is limited by the bottom 61 so that the depth of the bite by the claws 62 can be limited to a specified magnitude.

Figure 22:
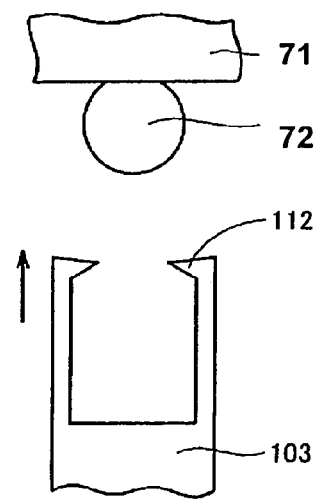
FIG. 22 is a first diagram illustrating an operating condition of a contact probe conceived as a comparative example in Embodiment 6.
Figure 23:
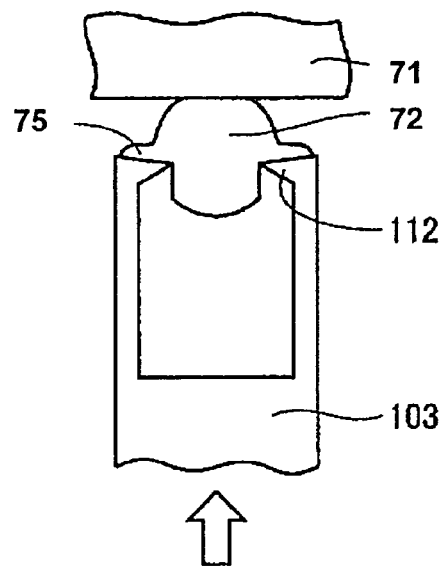
FIG. 23 is a second diagram illustrating another operating condition of the contact probe conceived as a comparative example in Embodiment 6.
Figure 24:
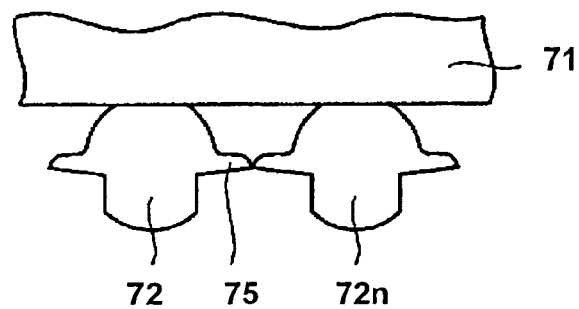
FIG. 24 is a diagram illustrating a situation in which the neighboring burrs make contact with each other when the measurement is conducted by using the contact probe conceived as a comparative example in Embodiment 6.

Here, as a comparative example against the contact probe 80, a contact probe is conceived without providing the foregoing bottom 61 acting as a stopper. For example, FIG. 22 shows a contact probe 103 provided with fixed bar- or board-shaped members having claws 112 facing each other at the upper ends of the members. As the contact probe 103 advances toward the solder ball 72 as shown by an arrow in FIG. 22, the claws 112 bite the solder ball 72. In this case, the absence of the bottom 61 acting as a stopper produces the condition under which the depth of the bite by the claws 112 is determined solely by the advancing distance of the contact probe 103. As a result, the claws 112 tend to bite the solder ball 72 excessively. Furthermore, as shown in FIG. 23, the claws 112 deform the solder ball 72 by pressing the side portions of the solder ball 72 with the upper sides of the claws 112 rather than sticking into the solder ball 72. Consequently, burrs 75 are likely to be formed. Even after the contact probe 103 dissociates from the solder ball 72, the burrs 75 remain there without changing their shape. If the remaining burrs 75 are large to a certain extent, the neighboring burrs 75 of the solder balls 72 arranged with a small pitch may make contact with each other as shown in FIG. 24, creating a short-circuit problem.

On the other hand, the contact probe 80 explained by referring to FIGS. 19 to 21 is provided with the tip portion 60 having the bottom 61 acting as a stopper. The bottom 61 can prevent the claws 62 from biting the solder ball 72 excessively. Therefore, even if burrs are produced, their size is limited, and the short-circuiting can be avoided.

As explained above, the claws 62 are provided on the side walls of the recess 60 rather than on the bottom 61. As the tip portion 51 advances, the claws 62 scratch the solder ball 72 removing the insulating layer on the surface and engage with the solder ball 72. In other words, the claws 62 can perform scrubbing to secure the electrical continuity. Consequently, the dents are formed not at the lowermost portion of the solder ball 72 but at a place slightly shifted to the side. Therefore, this structure can avoid the "popcorn phenomenon" caused by the dents.

Figure 25:
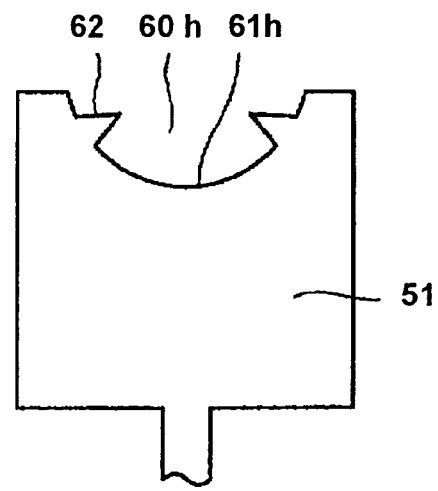
FIG. 25 is an enlarged plan view showing a tip portion of a second contact probe in Embodiment 6 according to the present invention.
Figure 26:
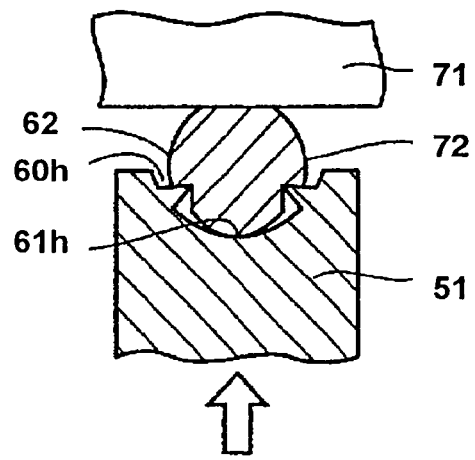
FIG. 26 is a cross-sectional view showing a situation in which a measurement is conducted through a solder ball by using the second contact probe in Embodiment 6 according to the present invention.

As for the shape of the recess on the tip portion, the recess 60 shown in FIGS. 19 to 21 has a nearly trapezoidal shape with a flat bottom and flat oblique faces. However, the shape is not limited to this type. For example, an arc-shaped recess 60h as shown in FIG. 25 may be employed. In this case, the innermost portion (referred to as 61h) of the recess 60h acts as a stopper as shown in FIG. 26.

In the above explanation, the recess has two bilaterally symmetrical claws 62 without regard to its shape. Nevertheless, it may have asymmetrically arranged claws. Moreover, the number of claws has no limitations providing that at least one claw is provided.

Figure 27:
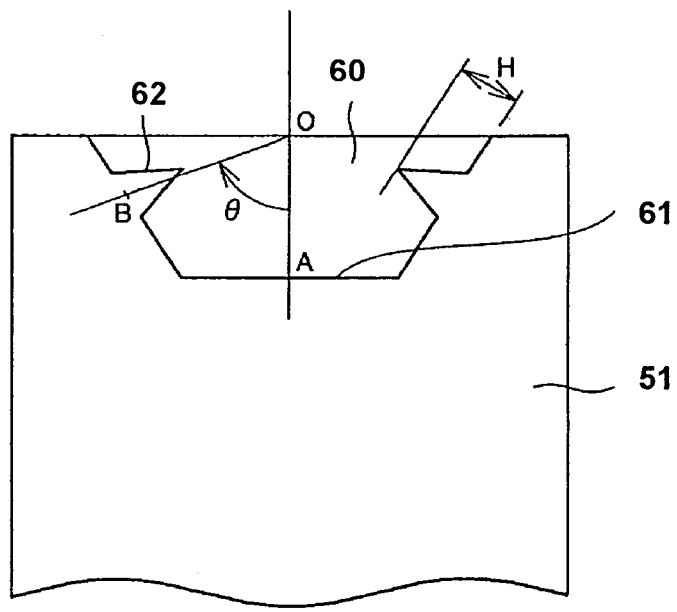
FIG. 27 is a diagram illustrating the position of the claws of the first contact probe in Embodiment 6 according to the present invention.
Figure 28:
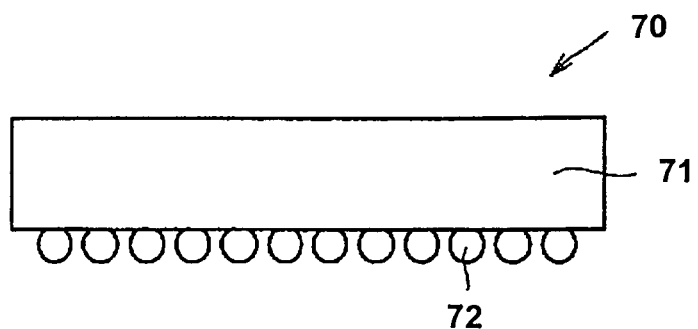
FIG. 28 is a front view showing an ordinary BGA package.
Figure 29:
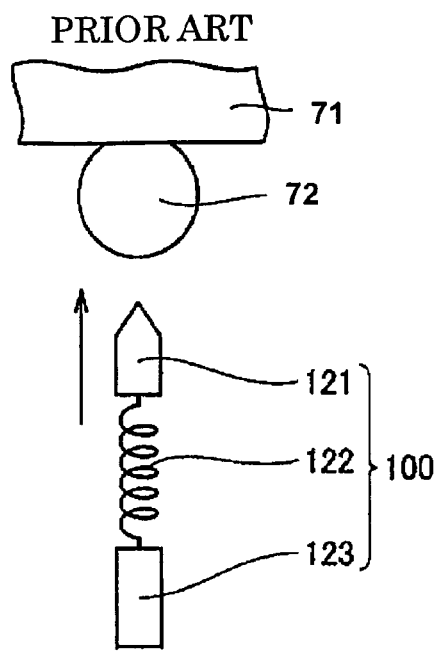
FIG. 29 is a diagram illustrating an example of the usage of a first contact probe of the prior art for a ball-shaped subject surface.
Figure 30:
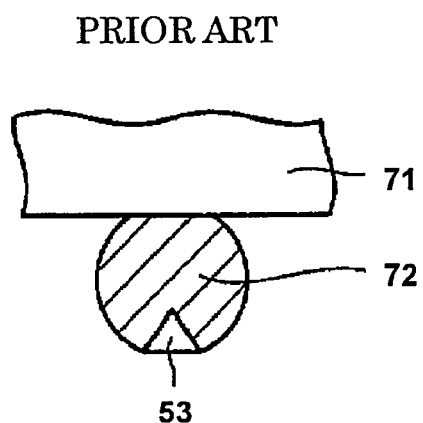
FIG. 30 is a cross-sectional view showing a solder ball after a measurement is conducted by using the first contact probe of the prior art for a ball-shaped subject surface.
Figure 31:
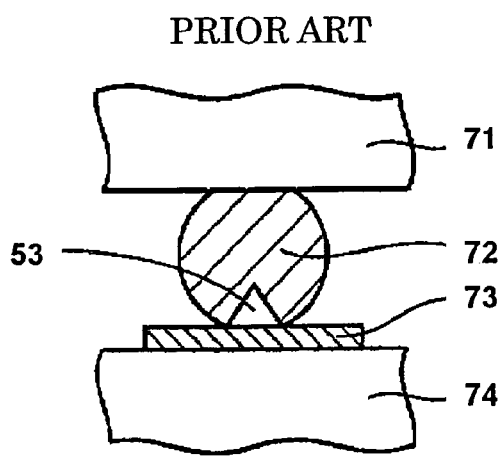
FIG. 31 is a cross-sectional view showing a situation in which a solder ball is used for soldering after a measurement is conducted by using the first contact probe of the prior art for a ball-shaped subject surface.
Figure 32:
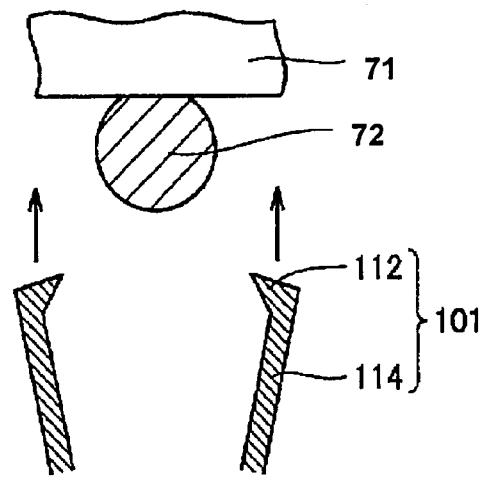
FIG. 32 is a first diagram illustrating an example of the usage of a second contact probe of the prior art for a ball-shaped subject surface.
Figure 33:
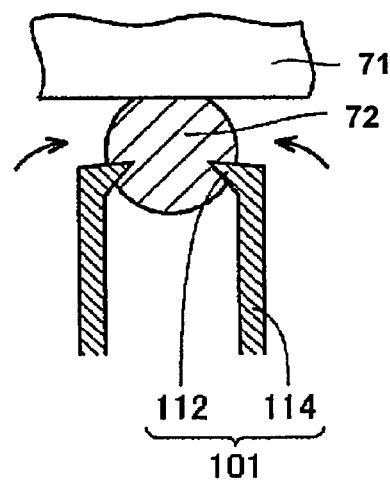
FIG. 33 is a second diagram illustrating the example of the usage of the second contact probe of the prior art for a ball-shaped subject surface.
Figure 34:
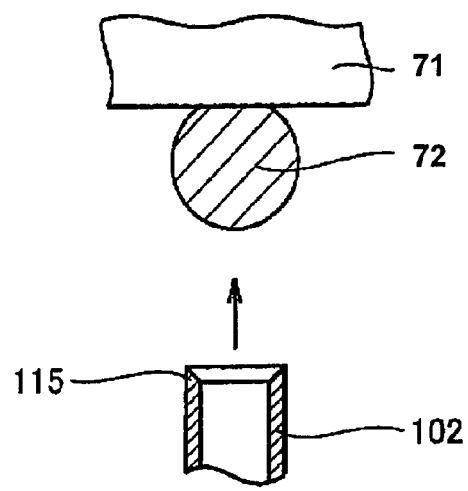
FIG. 34 is a first diagram illustrating an example of the usage of a third contact probe of the prior art for a ball-shaped subject surface.
Figure 35:
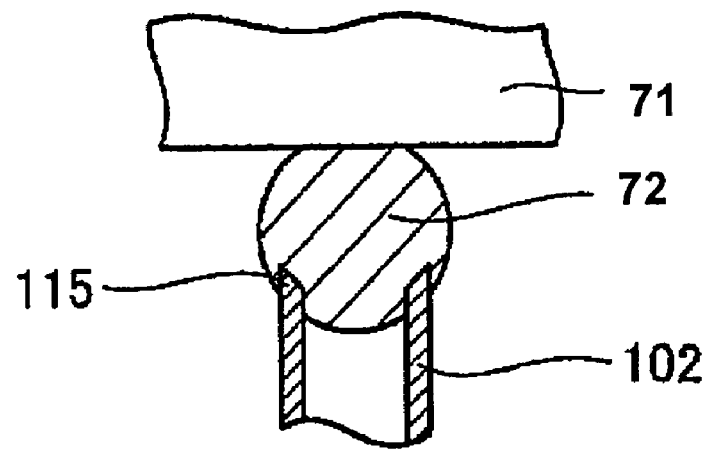
FIG. 35 is a second diagram illustrating the example of the usage of the third contact probe of the prior art for a ball-shaped subject surface.
Figure 36:
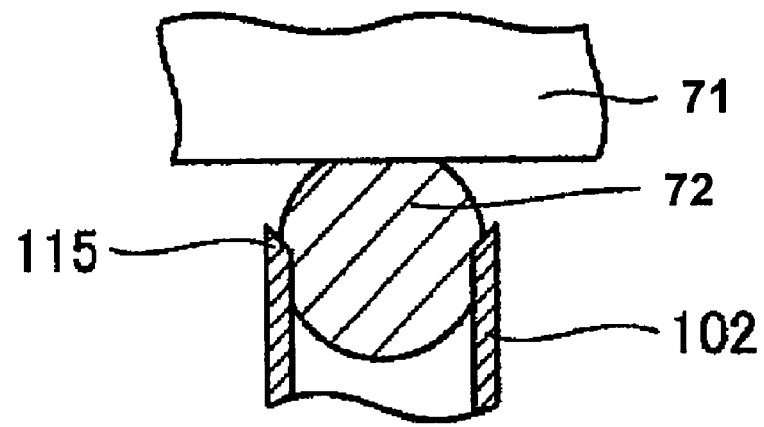
FIG. 36 is a cross-sectional view showing a situation in which a solder ball is pushed into the cylindrical tip portion when a measurement is conducted by using the third contact probe of the prior art for a ball-shaped subject surface.

Next, the position of the claws 62 in the recess 60 is explained by referring to FIG. 27. The position of the claw 62 as a protrusion can be expressed as position B that is shifted to the side by an angle of θ from the direction viewed from point O toward point A, where point O is the center of the opening of the recess 60, and point A is the center of the bottom 61. In this case, the rotational coordinate is established for each claw such that a positive value of θ0 is given to each claw. The present inventors found that when the angle θ is at least 45 degrees and at most 90 degrees, a satisfactory result can be attained. If the angle θ is less than 45 degrees, the claw 62 sticks into the solder ball 72 in the vicinity of the lowermost position of the solder ball 72, creating the possibility of the popcorn phenomenon. If the angle θ is more than 90 degrees, the claw 62 scrubs the solder ball 72 for a needlessly long distance. On the other hand, when the angle θ is at least 45 degrees and at most 90 degrees, the solder ball 72 can be scrubbed for a proper distance, and the popcorn phenomenon can be prevented.

In addition, the present inventors found that when the height H (from the root to the pointed end) of the claw 62 as a protrusion is at most ¼ the radius of the solder ball 72 as a subject ball-shaped electrode, the development of the burrs can be most effectively prevented. If the height H is more than ¼ the radius of the solder ball 72, the depth of bite by the claw into the solder ball increases needlessly, creating a problem of burring. On the other hand, when the height H is less than ¼ the radius of the solder ball 72, the creation of the burring problem can be suppressed.

The position and height of the claw are explained above by referring to the trapezoidal recess 60 as shown in FIG. 27. The same explanation is to be applied not only to the arc-shaped recess 60h as shown in FIG. 25 but also to a recess having a different shape.

Unlike conventional contact probes produced by machining, the contact probe produced as a unitary structure by the LIGA process is advantageous in that it can be easily produced with high precision in terms of the position, direction, height, etc. of the claw without regard to the number of claws.

The embodiments disclosed in this specification are to be considered in all respects as illustrative and not restrictive. The scope of the present invention is indicated by the following claims rather than by the foregoing description. All changes that come within the meaning and range of equivalency of the claims are therefore intended to be embraced in the scope of the present invention.

INDUSTRIAL APPLICABILITY

A contact probe of the present invention is provided with a tip portion having two corner portions. The one opposite to the other one that moves in the lead during the scrubbing by the pressing force has a radius of curvature larger than that of the other one. Consequently, whereas the scrubbing by the pressing force sufficiently removes the surface layer of the subject surface to secure the electrical contact, the scrubbing at the time of dissociation can reduce the amount of removal. As a result, the contact probe can minimize the production of shavings and reduce the scratches on the subject surface.

Another contact probe of the present invention for a ball-shaped electrode is provided with a tip portion having a recess. The recess is provided with a specific protrusion and a bottom. The protrusion bites the side portion of a ball-shaped electrode, such as one used in a BGA package, to remove the insulating layer on the surface of the electrode. Thus, electrical continuity needed for the measurement can be secured. The bottom of the recess makes contact with the lowermost portion of the ball-shaped electrode to limit the movement of the tip portion, thereby preventing the protrusion from excessively biting the electrode. As a result, the contact probe can avoid the short-circuiting between the neighboring electrodes due to an excessive burr. The contact probe can also avoid the locking of the protrusion in the electrode due to an excessive bite.

The invention claimed is:

1. A contact probe, comprising:
   (a) a tip portion that makes contact with a subject surface, the tip portion comprising:
      (a1) a first corner portion that is provided at one side of the tip portion (hereinafter referred to as the first side) and that is rounded with a first radius of curvature; and
      (a2) a second corner portion that is provided at the opposite side of the tip portion (hereinafter referred to as the second side), that is connected to the first corner portion at a connecting point at the tip of the tip portion, and that is rounded with a second radius of curvature different from the first radius of curvature;
   (b) a supporting portion that supports the other portions and performs electrical connection; and
   (c) a spring portion that connects the tip portion to the supporting portion; the tip portion, the supporting portion, and the spring portion being structured such that when the supporting portion is fixed to an inspecting apparatus and when the tip portion is pressed against the subject surface, the elastic deformation of the spring portion produced by the pressing force can move the tip portion with the first side in the lead maintaining the contact between the tip portion and the subject surface,
   wherein the first side is provided with a suppressing portion adjacent to the first corner portion, and the suppressing portion presses against the subject surface a bulging portion produced by the first corner portion and
   the second radius of curvature is larger than the first radius of curvature.

2. A contact probe as defined by claim 1, wherein the suppressing portion comprises at least one suppressing face that is opposed to the subject surface.

3. A contact probe as defined by claim 2, wherein the suppressing portion comprises a plurality of the suppressing faces that are connected in the form of a step-wise structure.

4. A contact probe as defined by claim 1, wherein:
   (a) the first radius of curvature is larger than the second radius of curvature;
   (b) the second side is provided with a suppressing portion adjacent to the second corner portion; and
   (c) the suppressing portion presses a bulging portion produced by the second corner portion against the subject surface.

5. A contact probe as defined by claim 4, wherein the suppressing portion comprises a suppressing face that is opposed to the subject surface.

* * * * *